(12) United States Patent
Dong et al.

(10) Patent No.: US 10,204,921 B2
(45) Date of Patent: Feb. 12, 2019

(54) ARRAY SUBSTRATE ASSEMBLY AND TFT DISPLAY APPARATUS COMPRISING THE SAME

(71) Applicants: BOE Technology Group Co., Ltd., Beijing (CN); Hefei BOE Optoelectronics Technology Co., Ltd., Anhui (CN)

(72) Inventors: Zhifu Dong, Beijing (CN); Hongmin Li, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/502,805

(22) PCT Filed: Jul. 22, 2016

(86) PCT No.: PCT/CN2016/090992
§ 371 (c)(1),
(2) Date: Feb. 9, 2017

(87) PCT Pub. No.: WO2017/076071
PCT Pub. Date: May 11, 2017

(65) Prior Publication Data
US 2017/0278871 A1    Sep. 28, 2017

(30) Foreign Application Priority Data

Nov. 3, 2015 (CN) .................. 2015 2 0881760 U

(51) Int. Cl.
*H01L 27/12* (2006.01)
*H01L 23/60* (2006.01)

(52) U.S. Cl.
CPC .......... *H01L 27/1214* (2013.01); *H01L 23/60* (2013.01); *H01L 27/12* (2013.01)

(58) Field of Classification Search
CPC .......................... H01L 27/1214; H01L 23/60
See application file for complete search history.

(56) References Cited

U.S. PATENT DOCUMENTS

2014/0027726 A1\*  1/2014  Choi ................... H01L 51/5203
                                                      257/40

FOREIGN PATENT DOCUMENTS

| CN | 101630078 A | 1/2010 |
|---|---|---|
| CN | 205069639 U | 3/2016 |

OTHER PUBLICATIONS

International Search Report and Written Opinion of International Application No. PCT/CN2016/090992, dated Sep. 26, 2016, 10 pages.

(Continued)

*Primary Examiner* — Trang Q Tran
(74) *Attorney, Agent, or Firm* — Westman, Champlin & Koehler, P.A.

(57) ABSTRACT

Embodiments of the present invention provide an array substrate assembly and a display apparatus including the array substrate assembly. The array substrate assembly includes a display region and a non-display region around the display region. A static electricity leading layer electrically insulated from the display region is disposed in the non-display region.

10 Claims, 2 Drawing Sheets

(56) References Cited

OTHER PUBLICATIONS

English translation of Box No. V of the Written Opinion for the International Searching Authority for International Application No. PCT/CN2016/090992, 2 pages.

* cited by examiner

ARRAY SUBSTRATE ASSEMBLY AND TFT DISPLAY APPARATUS COMPRISING THE SAME

CROSS-REFERENCE TO RELATED APPLICATIONS

This application is a Section 371 National Stage Application of International Application No. PCT/CN2016/090992, filed on 22 Jul. 2016, entitled "ARRAY SUBSTRATE ASSEMBLY AND TFT DISPLAY APPARATUS COMPRISING THE SAME", which has not yet published, which claims priority to Chinese Application No. 201520881760.8, filed on 3 Nov. 2015, incorporated herein by reference in their entirety.

BACKGROUND

1. Technical Field

Embodiments of the present invention relate to an array substrate assembly, and a thin film transistor (TFT) display apparatus comprising the array substrate assembly.

2. Description of the Related Art

FIGS. 1 and 2 show a conventional array substrate assembly 1 for a TFT display screen. The array substrate assembly 1 comprises a display region 11 and a non-display region 12. Disposed in the non-display region 12 are a gate driver circuit (gate-driver on array (GOA)) 121, a static electricity leading ring (GND) 122, a data driver circuit 123, a flexible printed circuit (FPC) 124, a substrate 126 and an insulating layer 125. In the conventional array substrate assembly 1, static electricity is resisted mainly by means of the static electricity guiding ring 122, thereby protecting the display screen. However, the conventional array substrate assembly 1 with such a structure has a problem of a weak resistance of the TFT display screen to electrostatic charges.

SUMMARY

According to embodiments of the present invention, there is provided an array substrate assembly comprising: a display region and a non-display region around the display region, wherein a static electricity leading layer electrically insulated from the display region is disposed in the non-display region.

According to embodiments of the present invention, the non-display region is a planar region corresponding to an exposed portion of a substrate around the display region, and an insulating layer is disposed over the substrate and is located between the substrate and the static electricity leading layer.

According to embodiments of the present invention, a static electricity leading ring around the display region is disposed in the non-display region, a gate driver circuit and a data driver circuit are disposed between the static electricity leading ring and the display region, the non-display region further comprises a flexible printed circuit with which the static electricity leading ring is electrically connected, and the static electricity leading ring is located between the substrate and the insulating layer.

According to embodiments of the present invention, a static electricity leading ring around the display region is disposed in the non-display region, the non-display region further comprises a flexible printed circuit with which the static electricity leading ring is electrically connected, and the static electricity leading ring is located between the substrate and the insulating layer.

According to embodiments of the present invention, the static electricity leading layer is electrically connected to a ground signal terminal of the flexible printed circuit.

According to embodiments of the present invention, the static electricity leading layer is electrically connected directly to the ground signal terminal of the flexible printed circuit through a via hole formed in a portion of the insulating layer over the flexible printed circuit.

According to embodiments of the present invention, the static electricity leading layer is formed of a transparent electrically-conductive material.

According to embodiments of the present invention, the static electricity leading layer is formed of indium tin oxide (ITO).

According to embodiments of the present invention, the static electricity leading layer is formed by means of a sputtering technology.

According to embodiments of the present invention, there is provided a TFT display apparatus comprising one of the above-mentioned array substrate assemblies.

DETAILED DESCRIPTION OF THE EMBODIMENTS

Embodiments of the present invention will be described as follows in detail in conjunction with the accompanying drawings.

Figure 1:
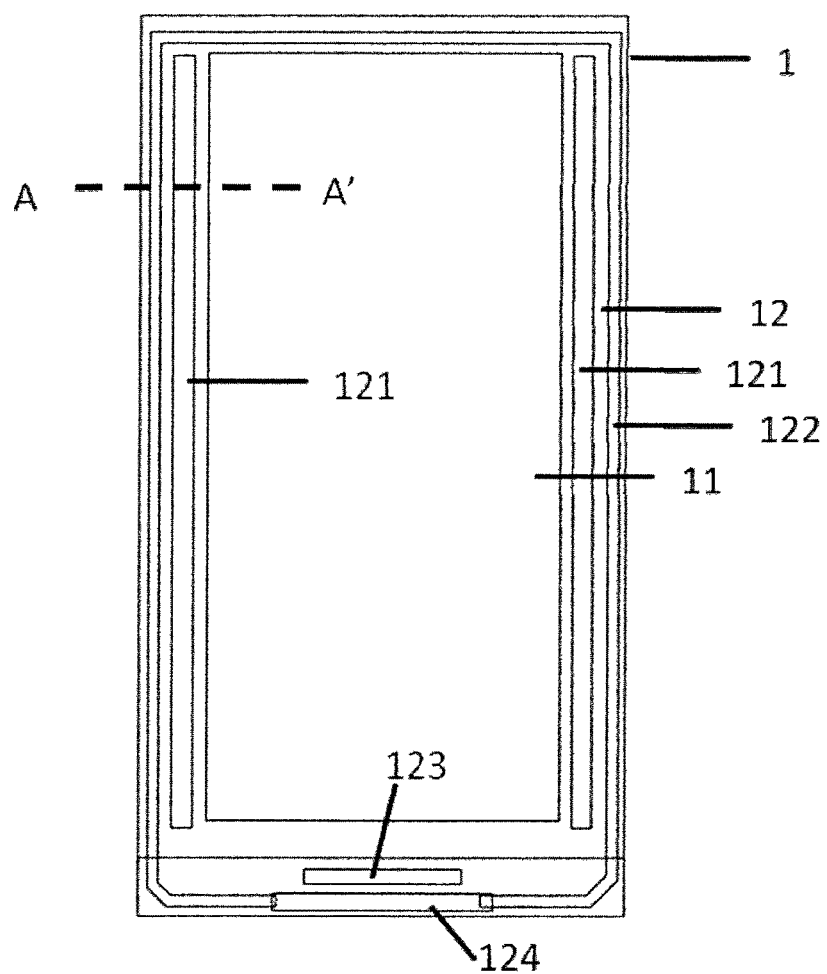
FIG. 1 is a schematic view showing a structure of a conventional array substrate assembly.
Figure 2:
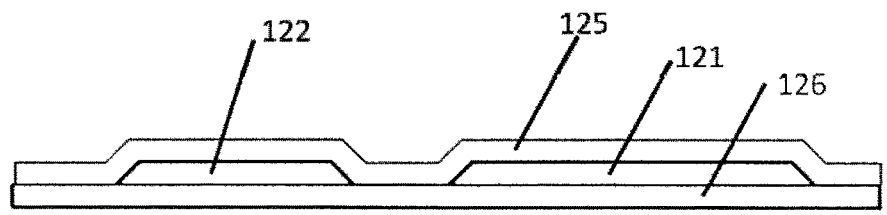
FIG. 2 is a sectional view of the array substrate assembly shown in FIG. 1 which is taken along a line A-A'.
Figure 3:
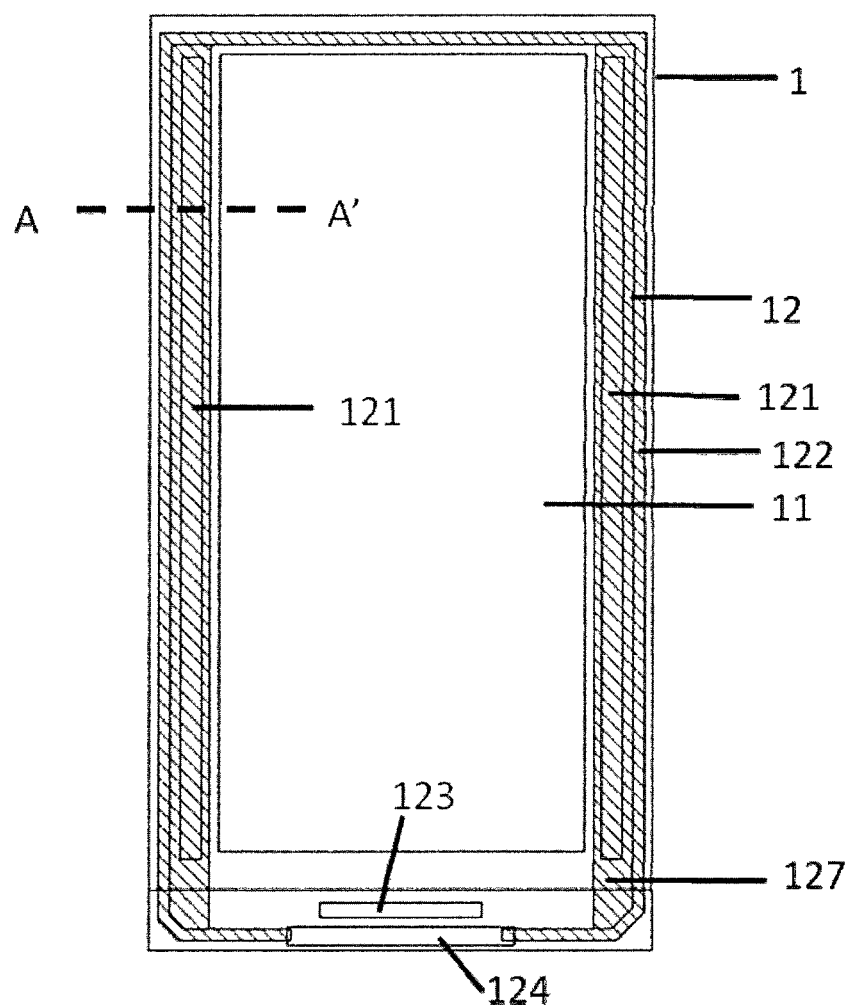
FIG. 3 is a schematic view showing a structure of an array substrate assembly according to an embodiment of the present invention.
Figure 4:
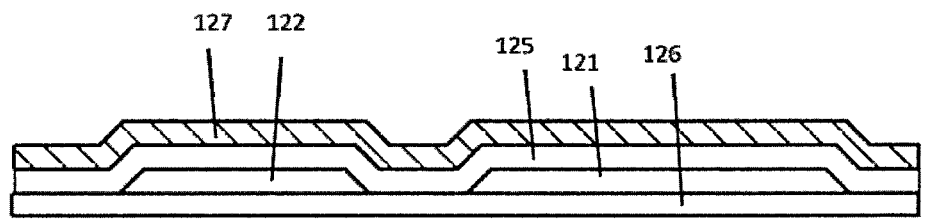
FIG. 4 is a sectional view of the array substrate assembly shown in FIG. 3 which is taken along a line A-A'.

FIG. 3 is a schematic view showing a structure of an array substrate assembly 1 (also referred to as a TFT substrate assembly) for a TFT display apparatus according to an embodiment of the present invention. FIG. 4 is a sectional view of the array substrate assembly 1 shown in FIG. 3 which is taken along a line A-A'. The array substrate assembly 1 shown in FIG. 3 comprises a display region 11 and a non-display region 12 around the display region 11. The non-display region 12 corresponds to an exposed region of a substrate 126 around the display region 11 (as shown in FIG. 4). A static electricity leading ring 122 around the display region 11 is disposed in the non-display region 12, and a gate driver circuit 121 and a data driver circuit 123 are disposed between the static electricity leading ring 122 and the display region 11. The non-display region 12 further comprises a flexible printed circuit 124 with which the static electricity leading ring 12 is electrically connected to form a loop, thereby leading away electrostatic charges collected by the static electricity leading ring 122.

As shown in FIG. 4, an insulating layer 125 is further disposed over the substrate 126 in the non-display region 12. The insulating layer 125 covers the gate driver circuit 121, the static electricity leading ring 122, the data driver circuit 123, and the flexible printed circuit 124, which are disposed over the substrate 126. In addition, a static electricity leading layer 127 is further disposed on the insulating layer 125 in the non-display region 12. The static electricity leading layer 127 is electrically insulated from the display region 11. A via hole leading to the ground signal terminal of the flexible printed circuit 124 is formed in a portion of the insulating layer 125 over the flexible printed circuit 124. The static electricity leading layer 127 is electrically connected directly to the ground signal terminal of the flexible printed circuit 124 through the via hole. The static electricity leading layer 127 may be made of a transparent electrically-conductive material. For example, the static electricity leading layer 127 is formed of indium tin oxide used to manufacture the display region 11. The static electricity leading layer 127 may be formed by means of a sputtering technology. For example, the static electricity leading layer 127 may be formed of the same material by the same technology as being used for forming an electrically conductive layer in the display region 11. Specifically, like a conventional technology, these metal layers and insulating layers are formed in sequence by using steps such as coating, photolithography, developing and the like in turn. In the last step, a transparent static electricity leading layer 127 is formed over the existing static electricity leading ring 122 and gate driver circuit 121 with the latest mask without using of any additional mask.

Embodiments of the present invention further provide a TFT display apparatus comprising the abovementioned array substrate assembly 1.

With the static electricity leading layer according to the embodiments of the present invention, addition of the static electricity leading layer enables the array substrate assembly to have a larger surface area for collecting static electricity, while no additional manufacturing technology of the array substrate assembly is included and a manufacturing cost of the array substrate assembly is not increased, so that almost the entire non-display region can be used to collect electrostatic charges and thus the collected electrostatic charges are directly led away through the flexible printed circuit. Therefore, antistatic capability of the array substrate assembly is remarkably improved.

It could be appreciated by those skilled in the art that the material and the technology for forming the static electricity leading layer according to the embodiments of the present invention are exemplary, and may be modified and changed.

With the array substrate assembly and the display apparatus comprising the array substrate assembly according to the embodiments of the present invention, electrostatic charge dispersing and leading capability of a TFT display screen are improved.

The array substrate assembly and the display apparatus according to the embodiments of the present invention have the static electricity leading layer with a large area which is configured to collect charges, thereby enhancing a capacity of storing the charges. Therefore, static electricity can be led away in time, thereby further enhancing antistatic capability in addition to leading away of the charges by means of the static electricity leading ring. As a result, a display screen is effectively protected. Furthermore, material and technology for manufacturing the array substrate assembly according to the embodiments of the present invention is in common with conventional material and technology for manufacturing an array substrate assembly. Therefore, static electricity dispersing and leading capability can be remarkably improved while almost no cost is added.

The above embodiments are only used to explain the present invention, and should not be construed to limit the present invention. It will be understood by those skilled in the art that various changes and modifications may be made therein without departing from the spirit of the present invention, the scope of which is defined in the appended claims and their equivalents.

What is claimed is:

1. An array substrate assembly comprising:
   a substrate;
   a display region and a non-display region around the display region, the non-display region comprising a flexible printed circuit disposed on the substrate and having a ground signal terminal;
   a static electricity leading layer electrically insulated from the display region, disposed over the substrate in the non-display region, and electrically connected to the ground signal terminal of the flexible printed circuit;
   a gate driver circuit and a data driver circuit which are disposed on the substrate in the non-display region; and
   an insulating layer disposed over the substrate, covering at least one of the gate driver circuit and the data driver circuit, and located between the substrate and the static electricity leading layer.

2. The array substrate assembly of claim 1, wherein:
   the non-display region is a planar region corresponding to an exposed portion of the substrate around the display region.

3. The array substrate assembly of claim 2, wherein:
   a static electricity leading ring around the display region is disposed in the non-display region, the gate driver circuit and the data driver circuit are disposed between the static electricity leading ring and the display region, the static electricity leading ring is electrically connected with the flexible printed circuit, and the static electricity leading ring is located between the substrate and the insulating layer.

4. The array substrate assembly of claim 2, wherein:
   a static electricity leading ring around the display region is disposed in the non-display region, the static electricity leading ring is electrically connected with the flexible printed circuit, and the static electricity leading ring is located between the substrate and the insulating layer.

5. The array substrate assembly of claim 1, wherein:
   the static electricity leading layer is electrically connected directly to the ground signal terminal of the flexible printed circuit through a via hole formed in a portion of the insulating layer over the flexible printed circuit.

6. The array substrate assembly of claim 1, wherein:
   the static electricity leading layer is formed of a transparent electrically-conductive material.

7. The array substrate assembly of claim 6, wherein:
   the static electricity leading layer is formed of indium tin oxide.

8. The array substrate assembly of claim 7, wherein:
   the static electricity leading layer is formed by means of a sputtering technology.

9. A display apparatus comprising:
   the array substrate assembly of claim 1.

10. The array substrate assembly of claim 9, wherein:
    the static electricity leading layer is electrically connected directly to the ground signal terminal of the flexible printed circuit through a via hole formed in a portion of the insulating layer over the flexible printed circuit.

* * * * *